US007863990B2

(12) United States Patent
Suda

(10) Patent No.: US 7,863,990 B2
(45) Date of Patent: Jan. 4, 2011

(54) OSCILLATION CIRCUIT, TEST APPARATUS AND ELECTRONIC DEVICE

(75) Inventor: Masakatsu Suda, Tokyo (JP)

(73) Assignee: Advantest Corporation, Tokyo (JP)

(*) Notice: Subject to any disclaimer, the term of this patent is extended or adjusted under 35 U.S.C. 154(b) by 263 days.

(21) Appl. No.: 12/136,046

(22) Filed: Jun. 9, 2008

(65) Prior Publication Data

US 2009/0146703 A1 Jun. 11, 2009

Related U.S. Application Data

(63) Continuation of application No. PCT/JP2006/324951, filed on Dec. 14, 2006.

(30) Foreign Application Priority Data

Dec. 20, 2005 (JP) .............................. 2005-367167

(51) Int. Cl.
*H03K 3/03* (2006.01)
(52) U.S. Cl. .................. 331/57; 331/135; 327/142; 327/146; 327/147; 327/156
(58) Field of Classification Search .................. 327/142, 327/146, 147, 156; 331/57, 135
See application file for complete search history.

(56) References Cited

U.S. PATENT DOCUMENTS 5,757,238 A * 5/1998 Ferraiolo et al. .............. 331/16
2001/0019291 A1* 9/2001 Nakano ........................ 331/57
2004/0247066 A1* 12/2004 Suda ............................ 375/376
2005/0231291 A1* 10/2005 Dally et al. .................. 331/16

FOREIGN PATENT DOCUMENTS

| JP | 3-057008 | 3/1991 |
| JP | 4-368020 | 12/1992 |
| JP | 7-249965 | 9/1995 |
| JP | 9-074339 | 3/1997 |

OTHER PUBLICATIONS

Korean Office Action for Korean Application No. 10-2008-7017484, mailed on May 28, 2010 (13 pages).

* cited by examiner

*Primary Examiner*—Arnold Kinkead
*Assistant Examiner*—Richard Tan
(74) *Attorney, Agent, or Firm*—Osha Liang LLP

(57) ABSTRACT

Provided is an oscillation circuit for generating an oscillation signal synchronized with a supplied reference clock, including: a voltage control oscillation section that, when triggered by each edge of the reference clock, stops oscillation of the oscillation signal having a frequency in accordance with a supplied control voltage to start new oscillation; a phase comparing section that compares a phase of a comparison signal that is in accordance with the oscillation signal outputted from the voltage control oscillation section and a phase of a signal that is in accordance with the reference clock; and a voltage control section that supplies the control voltage in accordance with a comparison result of the phase comparing section, to the voltage control oscillation section.

8 Claims, 7 Drawing Sheets

OSCILLATION CIRCUIT, TEST APPARATUS AND ELECTRONIC DEVICE

CROSS REFERENCE TO RELATED APPLICATION

This is a continuation application of PCT/JP2006/324951 filed on Dec. 14, 2006 which claims priority from a Japanese Patent Application No. 2005-367167 filed on Dec. 20, 2005, the contents of which are incorporated herein by reference.

BACKGROUND

1. Technical Field

The present invention relates to an oscillation circuit for generating an oscillation signal, a test apparatus including the oscillation circuit, and an electronic device including the oscillation circuit. In particular, the present invention relates to an oscillation circuit for generating an oscillation signal synchronized with a supplied reference clock.

2. Related Art

Conventionally, a PLL (Phase Locked Loop) circuit has been known as a circuit for generating an oscillation signal. The PLL circuit includes a voltage control oscillator such as a ring oscillator, a phase comparator for comparing the phases respectively of the reference clock and the oscillation signal outputted from the voltage control oscillator, a charge pump for outputting a control voltage responding to the phase comparison result, and a filter for controlling the oscillation frequency of the voltage control oscillator by passing the control voltage.

The difference between the period in each cycle of an oscillation signal outputted from the voltage control oscillator and the period of the signal to be generated is accumulated each time the signal circulates a loop circuit in the voltage control oscillator. The phase comparator detects the accumulated phase shift for each pulse of a reference clock. The charge pump and the filter generate a control voltage that causes the average of the accumulated phase shift to be substantially 0. Currently no related patent document has been recognized, and so the description thereof is omitted.

However, as described above, a conventional PLL circuit sends feedback so as to cause the average of the accumulated phase shift to be substantially zero. Therefore, there still exists a difference between the average of the phase deviation and the actual phase deviation in feedback, as a phase error.

For this reason, the conventional PLL circuit cannot generate an oscillation signal having the phase controlled with high accuracy. In a test apparatus for testing a device under test such as a semiconductor circuit, a clock generating circuit is used for generating a clock determining the operation of the test apparatus. When the above-described PLL circuit is used as such a clock generating circuit, the PLL circuit cannot test the device under test with high accuracy.

A PLL circuit is also provided in an electronic device such as an IC chip, for the purpose of generating a clock determining the operation of the electronic device. However, since the conventional PLL circuit cannot control the phase with high accuracy as described above, the electronic device will operate unstably. In addition, the charge pump and the filter require a large area for the circuits thereof, and therefore the conventional PLL circuit has a large circuitry dimension.

SUMMARY

In view of the above, it is an object of an aspect of the innovations herein to provide an oscillation circuit, a test apparatus, and an electronic device, which can solve the above problems. The above and other objects can be achieved by combinations described in the independent claims. The dependent claims define further advantageous and exemplary combinations of the innovations herein.

According to an exemplary oscillation circuit according to an aspect related to the innovations herein, provided is an oscillation circuit for generating an oscillation signal synchronized with a supplied reference clock, including: a voltage control oscillation section that, when triggered by each edge of the reference clock, stops oscillation of the oscillation signal having a frequency in accordance with a supplied control voltage to start new oscillation; a phase comparing section that compares a phase of a comparison signal that is in accordance with the oscillation signal outputted from the voltage control oscillation section and a phase of a signal that is in accordance with the reference clock; and a voltage control section that supplies the control voltage in accordance with a comparison result of the phase comparing section, to the voltage control oscillation section.

According to an exemplary test apparatus according to an aspect related to the innovations herein, provided is a test apparatus for testing a device under test, including: a pattern generating section that generates a test pattern for testing the device under test; an oscillation circuit that generates an oscillation signal in accordance with a frequency of a test signal to be inputted to the device under test, in synchronization with a supplied reference clock; a waveform shaping section that generates the test signal, based on the test pattern generated by the pattern generating section and the oscillation signal generated by the oscillation circuit; and a determining section that determines whether the device under test is defective or not, by comparing an output signal outputted from the device under test and an expected value pattern generated by the pattern generating section, where the oscillation circuit includes: a voltage control oscillation section that, when triggered by each edge of the reference clock, stops oscillation of the oscillation signal having a frequency in accordance with a supplied control voltage to start new oscillation; a phase comparing section that compares a phase of a comparison signal that is in accordance with the oscillation signal outputted from the voltage control oscillation section and a phase of a signal that is in accordance with the reference clock; and a voltage control section that supplies the control voltage in accordance with a comparison result of the phase comparing section, to the voltage control oscillation section.

According to an exemplary electronic device according to an aspect related to the innovations herein, provided is an electronic device including a plurality of operation circuits to operate according to a clock signal having a predetermined frequency, including: a plurality of oscillation circuits corresponding to the plurality of operation circuits, each oscillation circuit supplying the clock signal to a corresponding operation circuit; and a distribution buffer that receives a reference clock having a frequency smaller than the predetermined frequency from outside, and distributes the reference clock to each of the oscillation circuits, where each of the oscillation circuits includes: a voltage control oscillation section that, when triggered by each edge of the reference clock, stops oscillation of the oscillation signal having a frequency in accordance with a supplied control voltage to start new oscillation; a phase comparing section that compares a phase of a comparison signal that is in accordance with the clock signal outputted from the voltage control oscillation section and a phase of a signal that is in accordance with the reference clock; and a voltage control section that supplies the control voltage in accordance with a comparison result of the phase comparing section, to the voltage control oscillation section.

The summary clause does not necessarily describe all necessary features of the embodiments of the present invention. The present invention may also be a sub-combination of the features described above.

DESCRIPTION OF EXEMPLARY EMBODIMENTS

The invention will now be described based on the preferred embodiments, which do not intend to limit the scope of the present invention, but exemplify the invention. All of the features and the combinations thereof described in the embodiment are not necessarily essential to the invention.

Figure 1:
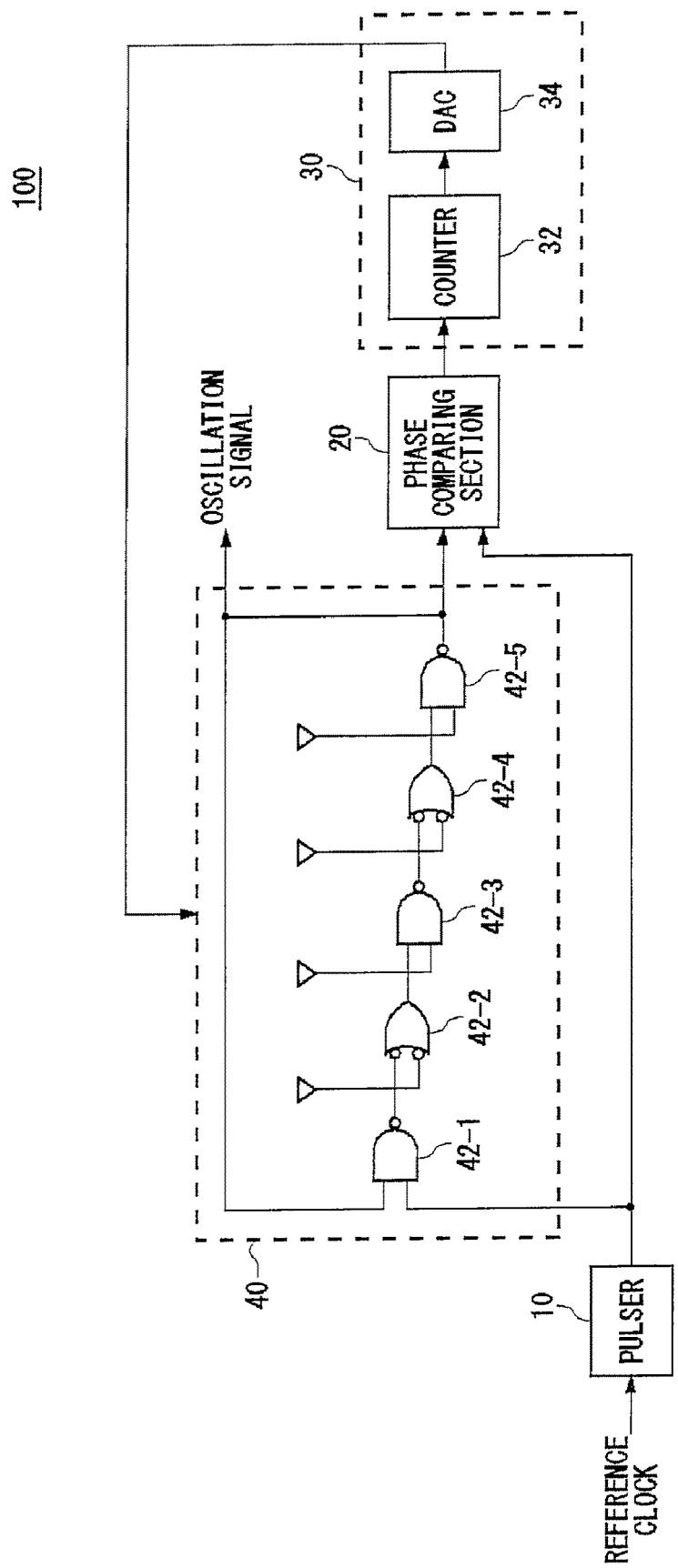
FIG. 1 shows an exemplary configuration of an oscillation circuit 100 according to an embodiment of the present invention.

FIG. 1 shows an exemplary configuration of an oscillation circuit 100 according to an embodiment of the present invention. The oscillation circuit 100 generates an oscillation signal in synchronization with a supplied reference clock, and includes a pulser 10, a voltage control oscillation section 40, a phase comparing section 20, and a voltage control section 30. The reference clock has a phase and a cycle in accordance with an oscillation signal to be generated by the oscillation circuit 100.

The pulser 10 outputs a pulse signal having a predetermined pulse width, in accordance with the edge of a supplied reference clock. For example, the pulser 10 may include a delay element, an inverter, and an AND circuit. The delay element delays the reference clock by a delay amount according to the pulse width to be generated. The AND circuit outputs either an AND or a NAND between the reference clock and the signal outputted from the inverter. According to the above-described configuration, a pulse signal having a desirable pulse width can be generated.

In the present example, the AND circuit outputs a NAND between the reference clock and the signal outputted from the inverter. That is, the pulser 10 in the present example outputs a pulse signal indicating the logical value L during a period of the pulse width from the rising edge of the reference clock.

The voltage control oscillation section 40, when triggered by each edge of a reference clock, sequentially generates an oscillation signal having a frequency in accordance with a supplied control voltage. In the present example, the voltage control oscillation section 40, when triggered by each pulse of a pulse signal outputted from the pulser 10, sequentially generates an oscillation signal. The voltage control oscillation section 40 may stop generating an oscillation signal in accordance with the leading edge of a pulse signal and start generating a new oscillation signal in accordance with the trailing edge of the pulse signal.

For example, the voltage control oscillation section 40 includes a ring oscillator in which a plurality of logical circuits are connected as a loop. In the present example, the voltage control oscillation section 40 includes a plurality of NAND circuits (42-1-42-5, hereinafter collectively referred to as "42"). In addition, the voltage control oscillation section 40 may desirably include, alternately, NAND circuits (42-1, 42-3, 42-5) for inverting an AND between supplied two signals and outputting the result, and a NAND circuits (42-2, 42-4) for inverting the supplied two signals and outputting OR.

Among the NAND circuits 42, the predetermined first NAND circuit 42-1 outputs an NAND between a signal outputted from the NAND circuit 42-5 in the preceding stage, and a pulse signal outputted from the pulser 10.

When the first NAND circuit 42-1 is assumed to be the first stage, the NAND circuits (42-2, 42-4) positioned in the even number of stages output a logical OR between a signal resulting from inverting the signal outputted from the NAND circuit 42 in the preceding stage and a signal resulting from inverting the logical value H. Moreover the NAND circuits (42-3, 42-5) positioned in the odd number of stages, other than the first NAND circuit 42-1, output an NAND between the signal outputted from the NAND circuit 42 in the preceding stage and the logical value H.

According to the above-described configuration, the voltage control oscillation section 40 generates an oscillation signal in accordance with each pulse of a pulse signal. That is, each time a new pulse of a pulse signal is supplied, the voltage control oscillation section 40 starts oscillation according to the pulse, and so the voltage control oscillation section 40 can generate an oscillation signal synchronized with a reference clock. The voltage control oscillation section 40 may output, to outside, a signal outputted from any NAND circuit 42, as an oscillation signal.

The phase comparing section 20 compares the phase of a comparison signal that is in accordance with the oscillation signal outputted from the voltage control oscillation section 40 and the phase of a signal that is in accordance with a reference clock. In the present example, the phase comparing section 20 receives an oscillation signal outputted from the voltage control oscillation section 40 as a comparison signal, and, for each pulse of a pulse signal, compares the phase of the oscillation signal and the phase of the pulse signal.

The voltage control section 34 controls the frequency of an oscillation signal generated by the voltage control oscillation section 40, by providing the voltage control oscillation section 40 with a control voltage that is in accordance with a comparison result of the phase comparing section 20. That is, each time the voltage control oscillation section 40 starts new oscillation, the voltage control section 34 sends feedback so as to approximate the frequency of each oscillation signal to a desirable frequency of the oscillation signal, based on the comparison result of the phase comparing section 20.

In the present example, the voltage control section 34 includes a counter 32 and a digital analogue converter (hereinafter "DAC") 34. The DAC 34 outputs a control voltage having a voltage level in accordance with a given set value. The counter 32 increases or decreases the set value of the DAC 34, by a predetermined change amount in accordance with each comparison result outputted from the phase comparing section 20 for each pulse of a pulse signal. For example, when the phase of a comparison signal supplied to the phase comparing section 20 is delayed from the phase of the pulse signal, the counter 32 decreases the set value of the DAC 34 in accordance with the pulse of the pulse signal, by a predetermined change amount. When the phase of the comparison signal is advanced from the phase of the reference clock, the counter 32 increases the set value of the DAC 34 by a predetermined change amount.

In this way, the voltage control oscillation section 40 starts new oscillation in accordance with each edge of a reference clock, and, for each oscillation, the voltage control section 34 approximates the frequency of the oscillation signal to a desirable frequency, thereby enabling to accurately generate an oscillation signal having desirable phase and frequency.

Figure 2:
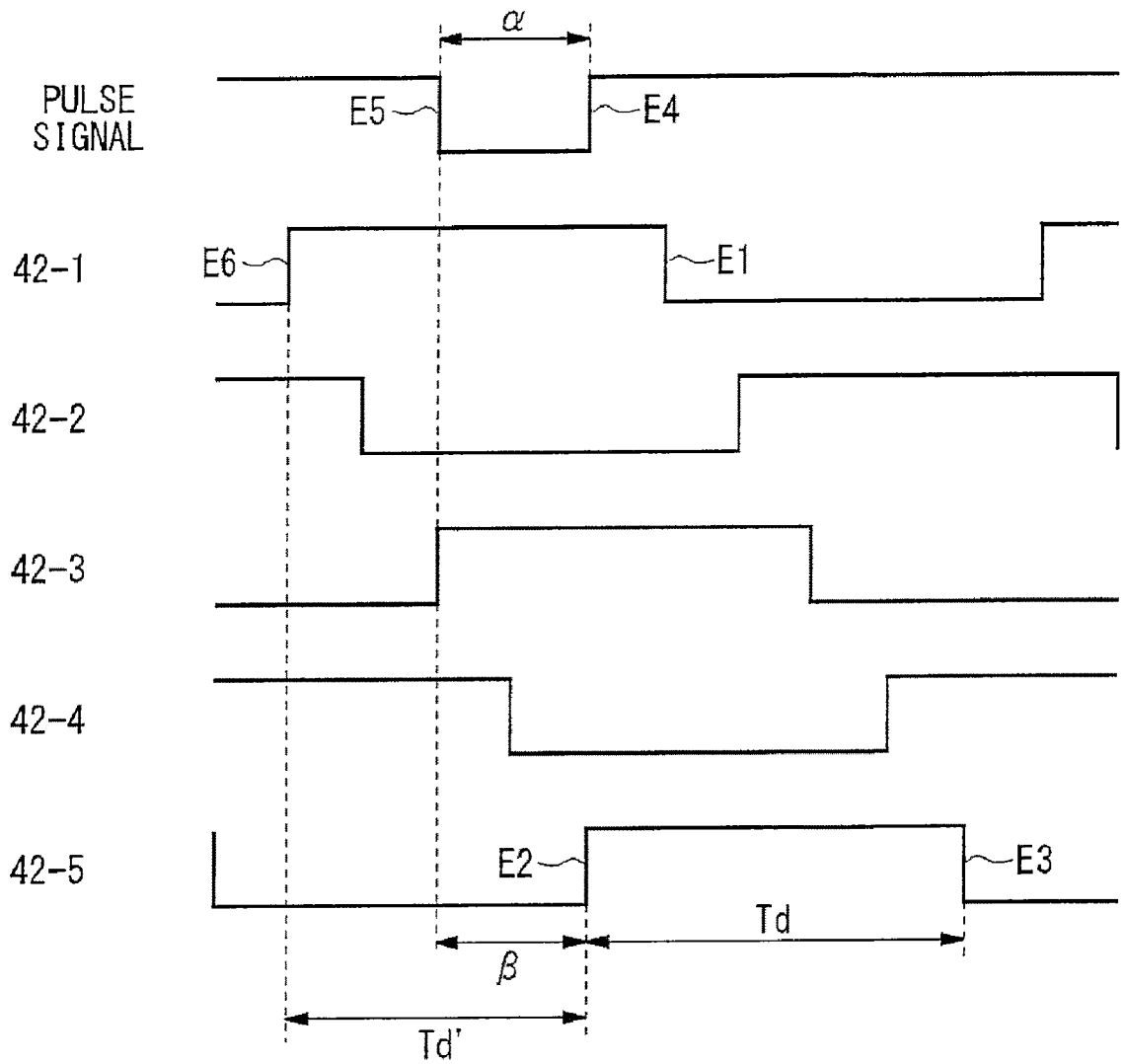
FIG. 2 is a timing chart showing an exemplary operation of a voltage control oscillation section 40.

FIG. 2 is a timing chart showing an exemplary operation of the voltage control oscillation section 40. In the present example, the pulse width of a pulse signal generated by the pulser 10 is denoted as $\alpha$. The pulse width of the oscillation signal, i.e. the time in which a signal travels one cycle of the loop path in the voltage control oscillation section 40, is denoted as Td.

The voltage control oscillation section 40 starts new oscillation in accordance with the pulse of a supplied pulse signal, as described above. In the present example, new oscillation starts by controlling, by the pulse of the pulse signal, the phase of the pulse outputted from the first NAND circuit 42-1 at the timing in accordance with the pulse.

The first NAND circuit 42-1 outputs the logical value H on condition that either the pulse signal indicates the logical value L or the NAND circuit 42-5 outputs the logical value L. In the present example, the rising edge of a signal outputted from the first NAND circuit 42-1 is formed in accordance with the falling edge of a signal outputted from the NAND circuit 42-5.

In addition, the first NAND circuit 42-1 outputs the logical value L on condition that the pulse signal indicates the logical value H and the NAND circuit 42-5 outputs the logical value H. According to this configuration, the voltage control oscillation section 40 controls the phase of the pulse outputted from the first NAND circuit 42-1, with a pulse of a pulse signal.

In this way, new oscillation in accordance with a pulse of a pulse signal starts by the trailing edge E1 of the signal outputted from the first NAND circuit 42-1. Here, when the phase of the rising edge E2 of the signal outputted from the NAND circuit 42-5 provided in the preceding stage of the first NAND circuit 42-1 is advanced from the phase of the rising edge E4 of the pulse signal, the edge E1 of the signal outputted from the first NAND circuit 42-1 will be determined according to the edge E4 of the pulse signal. Therefore the oscillation signal is synchronized with the reference clock.

However, when the phase of the edge E2 of the signal outputted from the NAND circuit 42-5 is delayed from the phase of the trailing edge E4 of the pulse signal, the edge E1 of the signal outputted from the first NAND circuit 42-1 will be determined according to the edge E2. Therefore the phase of the oscillation signal will have an error with respect to the phase of the reference clock, in accordance with the phase delay.

The edge E2 is outputted as a result of transmission, through the four-stage NAND circuits 42, of the rising edge E6 outputted from the first NAND circuit 42-1. The edge E6 has already been formed at least by the time when the edge E5 is inputted, and so the phase difference $\beta$ between the edge E5 and the edge E2 is restricted within the range smaller than the delay amount Td' of the four-stage NAND circuits 42.

That is, the delay $\beta-\alpha$ of the edge E2 from the edge E4 will be restricted within the range smaller than Td'–$\alpha$. In this way, the voltage control oscillation section 40 in the present example is able to generate an oscillation signal synchronized with the reference clock when the phase of the edge E2 is advanced from the phase of the edge E4, and is able to generate an oscillation signal having an error restricted within a predetermined range with respect to the phase of the reference clock when the phase of the edge E2 is delayed from the phase of the edge E4.

Figure 3:
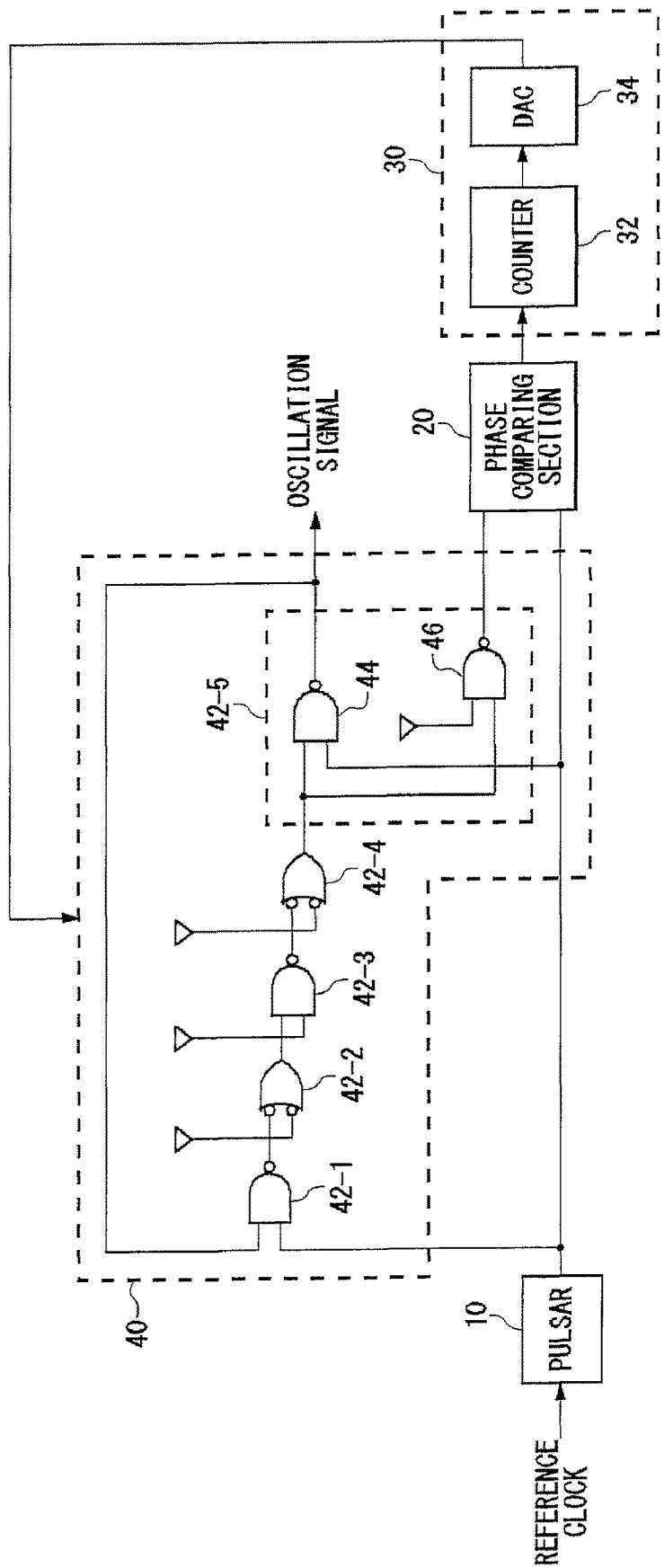
FIG. 3 shows another exemplary configuration of the oscillation circuit 100.

FIG. 3 shows another exemplary configuration of the oscillation circuit 100. The oscillation circuit 100 in the present example is different from the oscillation circuit 100 explained with reference to FIG. 1, in the configuration of the voltage control oscillation section 40. The other constituting elements have the same function and configuration as those of the corresponding constituting elements assigned the same reference numerals in FIG. 1.

The voltage control oscillation section 40 in the present example includes a plurality of NAND circuits 42-1-42-5, hereinafter collectively referred to as "42", which are connected into a loop and include a first NAND circuit 42-1 in the leading end and a second NAND circuit 42-2 in the trailing end, where each NAND circuit 42 has a delay amount that changes according to the control voltage.

The voltage control oscillation section 40 in FIG. 1 and FIG. 3 includes five-stage NAND circuits 42. However the voltage control oscillation section 40 may include any other odd number of NAND circuits 42. Moreover in the present example, the first NAND circuit 42-1 is provided in the leading end, and the second NAND circuit 42-5 is provided in the trailing end. However, this does not intend to limit the positions of the first NAND circuit 42-1 and the second NAND circuit 42-5. In fact, among any continuous two NAND circuits 42, it is possible to treat the NAND circuit 42-1 in the subsequent stage as the first NAND circuit 42-1, and the NAND circuit 42 in the preceding stage as the second NAND circuit 42-5.

The first NAND circuit 42-1 outputs an NAND between the signal outputted from the second NAND circuit 42-5 and the pulse signal, to the NAND circuit 42-2 in the subsequent stage. The second NAND circuit 42-5 outputs the loop signal being a NAND between the signal outputted from the NAND circuit 42-4 in the preceding stage and the pulse signal, to the first NAND circuit 42-1.

According to the above-stated configuration, the edge E2 explained with reference to FIG. 2 is formed at least by the time when the edge E5 is inputted. Therefore the phase of the edge E2 is advanced from the phase of the edge E4, and so no error is caused due to the phase delay such as mentioned above.

However, when the phase of the above-described loop signal is compared to the phase of the pulse signal in the phase comparing section 20, the phase of the loop signal differs from the phase of the edge E2 to be actually compared with the pulse signal. To counter this problem, the second NAND circuit 42-5 in the present example includes a loop output circuit 44 generating the loop signal, and a comparison output circuit 46 generating a comparison signal to be inputted to the phase comparing section 20.

The loop output circuit 44 outputs, to the first NAND circuit 42-1, a NAND between the signal outputted from the NAND circuit 42-4 in the preceding stage and the pulse signal, as the loop signal. The comparison output circuit 46 outputs, to the phase comparing section 20, a NAND between the signal outputted from the NAND circuit 42-6 in the preceding stage and the logical value H, as the comparison signal. That is, the comparison output circuit 46 outputs the same signal as the signal outputted from the NAND circuit 42-5 explained with reference to FIG. 1. For this reason, the phase comparing section 20 is able to compare the phase of the edge E2 to the phase of the pulse signal, as truly intended.

The above-described configuration enables to prevent the phase error of the oscillation signal attributable to the phase delay of the edge E2 explained in relation to FIG. 2. Therefore, it is possible to accurately synchronize the oscillation signal with the reference clock. In addition, since the phase comparing section 20 is able to accurately perform phase comparison, the frequency of the oscillation signal is controlled with high accuracy.

Figure 4:
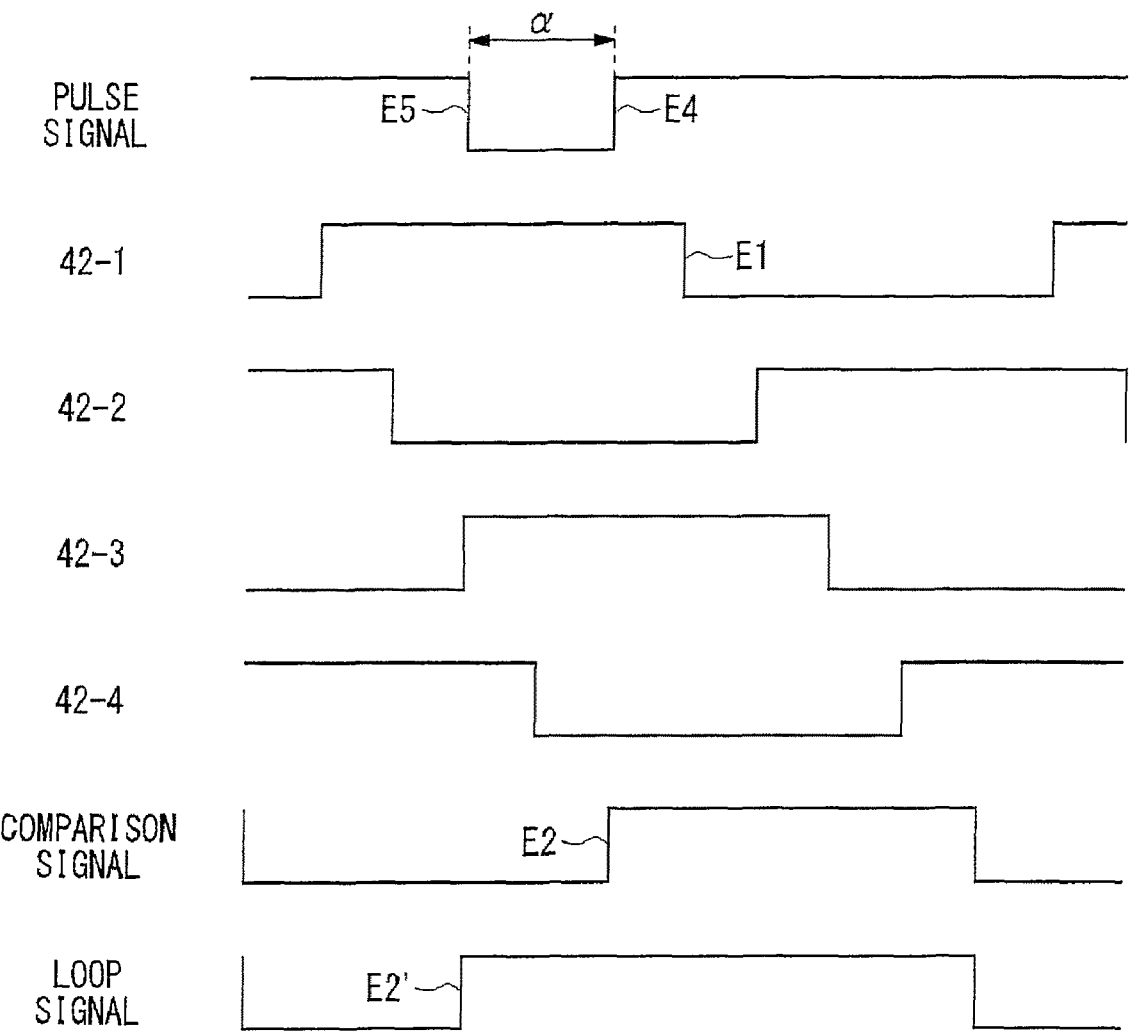
FIG. 4 shows an exemplary operation of the voltage control oscillation section 40 shown in FIG. 3.

FIG. 4 shows an exemplary operation of the voltage control oscillation section 40 shown in FIG. 3. As described above, the comparison output circuit 46 outputs the same comparison signal as the signal outputted from the NAND circuit 42-5 shown in FIG. 2. Therefore, the phase comparing section 20 compares the phase of the edge E2 of the signal and the phase of the pulse signal, thereby enabling to accurately compare the phase of the oscillation signal and the phase of the reference clock.

As also described above, the rising edge E2' of the loop signal outputted from the loop output circuit 44 has been formed at least by the time when the edge E5 of the pulse signal is inputted to the second NAND circuit 42-5. Therefore the phase of the edge E2' will be advanced from the phase of the edge E4 of the pulse signal, and the edge E1 of the signal outputted from the first NAND circuit 42-1 will be formed in accordance with the edge E4 of the pulse signal. Therefore the oscillation signal will be synchronized with the reference clock.

Here, the load capacity of the loop output circuit 44 is desirably substantially the same as the load capacity of the comparison output circuit 46. In addition, the load capacities respectively of the NAND circuits 42 in the voltage control oscillation section 40 shown in FIG. 1 and FIG. 3 are desirably substantially the same with each other.

Moreover, the signal delay time between the output end of the NAND circuit 42-4 and the input end of the first NAND circuit 42-1 is desirably substantially the same as the signal delay time between the output end of the NAND circuit 42-4 and the input end of the phase comparing section 20. The oscillation circuit 100 may include a section for controlling the signal delay times to be substantially the same as each other.

The pulser 10 shown in FIG. 1 and FIG. 3 desirably outputs a pulse signal having a pulse width smaller than half the cycle of the oscillation signal generated by the voltage control oscillation section 40. That is, the pulser 10 desirably outputs a pulse signal having a pulse width that is smaller than the time in which a signal travels one cycle of the loop path in the voltage control oscillation section 40. When the pulse width of the pulse signal is larger than half the cycle of the oscillation signal, the Duty ratio of the signal outputted from the first NAND circuit 42-1 or the like may occasionally fluctuate. However, the above-described conditions help prevent such a fluctuation of the Duty ratio.

In the oscillation circuit 100 described above, the pulse of the oscillation signal, the phase of which is compared to the phase of the pulse signal, is not controlled to a pulse to be emitted in a predetermined order. Therefore when the frequency of the initial oscillation signal differs largely from a desirable frequency for an oscillation signal, the pulse signal can occasionally be phase locked at a pulse different from an originally intended pulse.

For example, when the phase of the fourth pulse should be compared to the phase of the pulse signal, the phases of the third pulse and the fifth pulse are compared to the phase of the pulse signal, to generate a lock equalizing the phase of the pulse to the phase of the pulse signal. In this case, a resulting oscillation signal will have a cycle different from a desirable cycle.

It is desirable to initialize the control voltage outputted by the DAC 34 so as to approximate, to a desirable cycle, the cycle of the oscillation signal when the voltage control oscillation section 40 self-oscillates. The oscillation circuit 100 may further include a setting section for such initialization.

When an oscillation signal having a desirable cycle is generated after the initialization, the counter 32 supplies, to the DAC 34, a set value resulting from increasing or decreasing the value of the initialized set value, based on the comparison result of the phase comparing section 20. According to the above-described control, it becomes possible to compare the phase of the pulse of a desirable order of the oscillation signal and the phase of the pulse signal.

Figure 5:
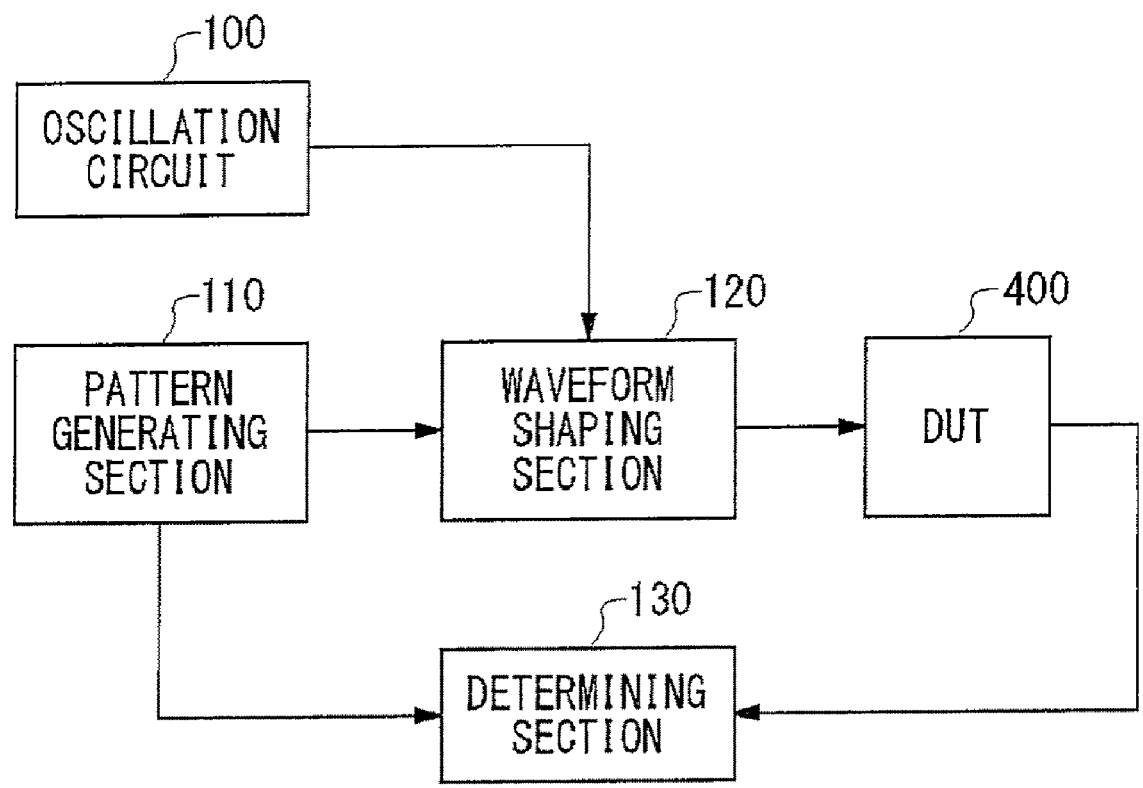
FIG. 5 shows an exemplary configuration of a test apparatus 200 according to an embodiment of the present invention.

FIG. 5 shows an exemplary configuration of a test apparatus 200 according to an embodiment of the present invention. The test apparatus 200 tests a device under test 400 such as a semiconductor device, and includes an oscillation circuit 100, a pattern generating section 110, a waveform shaping section 120, and a determining section 130.

The pattern generating section 110 generates a test pattern for testing the device under test 400. For example, the pattern generating section 110 generates a test pattern that contains a signal pattern of a test signal to be inputted to the device under test 400.

The waveform shaping section 120 generates a test signal to be inputted to the device under test 400, based on the test pattern generated by the pattern generating section 110. For example, the waveform shaping section 120 generates a test signal, the voltage value of which transitions corresponding to the test pattern, in response to a supplied timing clock.

The oscillation circuit 100 generates an oscillation signal in accordance with the frequency of a test signal to be inputted to the device under test, in synchronization with a supplied reference clock, and supplies the generated oscillation signal to the waveform shaping section 120, as a timing clock. The oscillation circuit 100 may have the same function and configuration as those of the oscillation circuit 100 explained in relation to FIG. 1 or FIG. 3.

The determining section 130 determines whether the device under test 400 is defective or not, by comparing the output signal outputted from the device under test and the supplied expected value pattern. The pattern generating section 110 may generate the expected value pattern based on a test pattern.

The test apparatus 200 in the present example is able to test the device under test 400 based on the timing clock, the phase of which is controlled with accuracy, so that the device under test 400 can be tested accurately.

Figure 6:
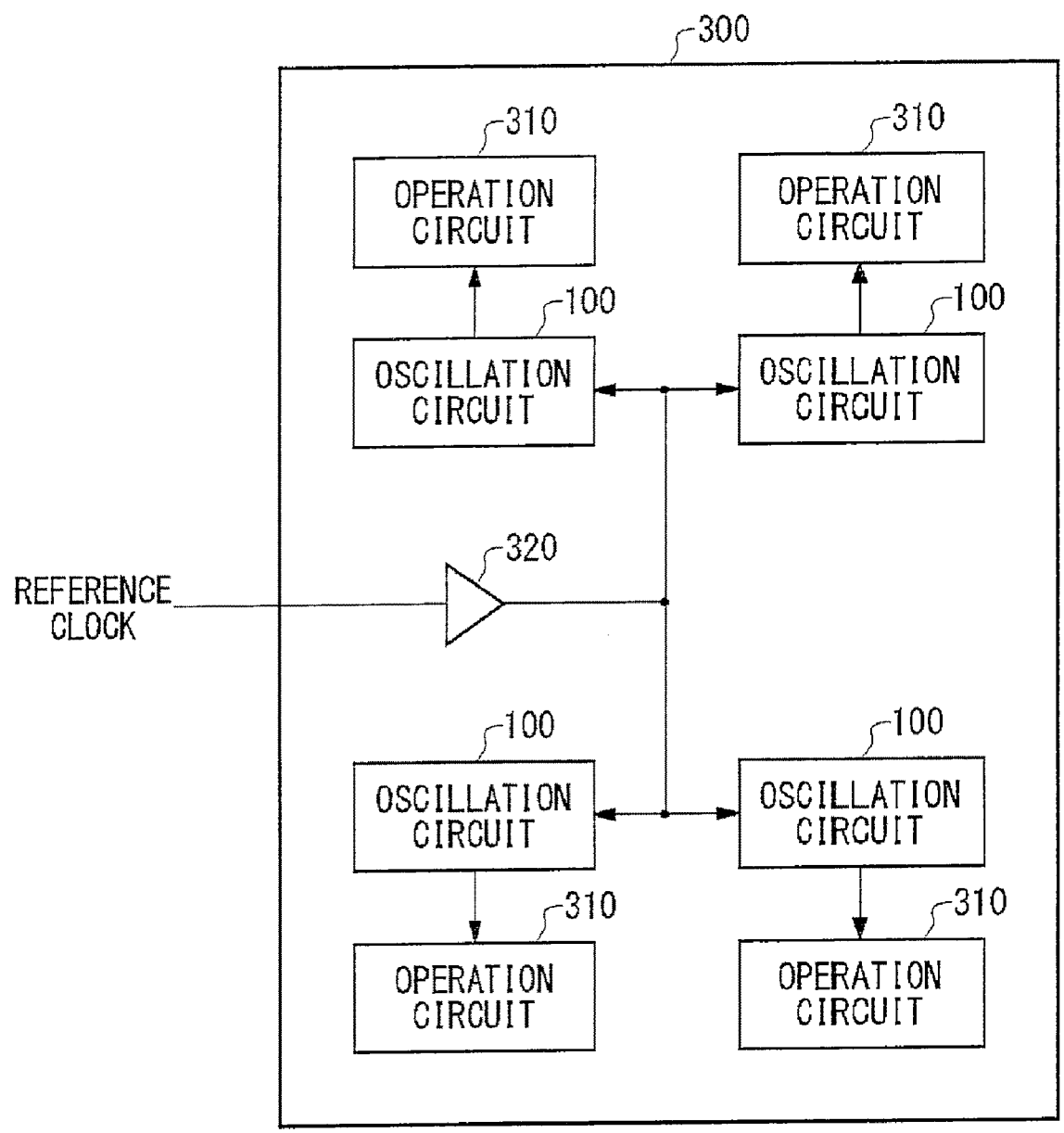
FIG. 6 shows an exemplary configuration of an electronic device 300 according to an embodiment of the present invention.

FIG. 6 shows an exemplary configuration of an electronic device 300 according to an embodiment of the present invention. The electronic device 300 includes a semiconductor circuit for example, and operates at a predetermined frequency. The electronic device 300 in the present embodiment includes a plurality of operation circuits 310, a plurality of oscillation circuits 100, and a distribution buffer 320.

Each of the operation circuits 310 is a semiconductor circuit formed on a semiconductor substrate, for example. For example, each operation circuit 310 may include a circuitry element in each predetermined region on the semiconductor substrate.

The plurality of oscillation circuits 100 correspond with the plurality of operation circuits 310. Here, each oscillation circuit 100 is provided within the same region in which the corresponding operation circuit 310 exists, and provides a clock signal having a predetermined frequency to the corresponding operation circuit 310. The oscillation circuit 100 may have the same function and configuration as those of the oscillation circuit 100 explained in relation to FIG. 1 or FIG. 3.

The distribution buffer 320 receives a reference clock having a frequency smaller than the frequency of the clock signal to be supplied to each operation circuit 310, and distributes the reference clock to each oscillation circuit 100. The oscillation circuit 100 generates a clock signal based on the reference clock, just as explained in relation to FIG. 1 or FIG. 3. The delay amount of the reference clock on the transmission path from the distribution buffer 320 is desirably substantially the same for each oscillation circuit 100.

Because not provided with a charge pump or a filter, the oscillation circuit 100 can have a smaller circuitry area than that of a conventional PLL circuit. Therefore an electronic device 300 can be provided with a multitude of oscillation circuits 100, so that each region of an electronic device 300 can be provided with one oscillation circuit 100.

In addition, a clock signal having a high frequency can be supplied to each operation circuit 310, by inputting, to the electronic device 300, a reference clock having a frequency smaller than the frequency of the clock signal to be supplied to each operation circuit 310, and by distributing the reference clock to each oscillation circuit 100 in each area. The driving force required for the distribution buffer becomes large in proportion to the frequency of the distributed signal. Therefore in the electronic device 300 in the present example, the distribution buffer 320 may have a small driving force, and the consumption power of the distribution buffer 320 as well as the skew in distributing the reference clock to each oscillation circuit 100 can be small.

The characteristic of the circuit receiving the clock from outside such as the distribution buffer 320 prevents the circuit from becoming the bottleneck of the operation speed of the electronic device 300, and facilitates high-speed operation approaching the limit of the operation circuit 310.

Figure 7:
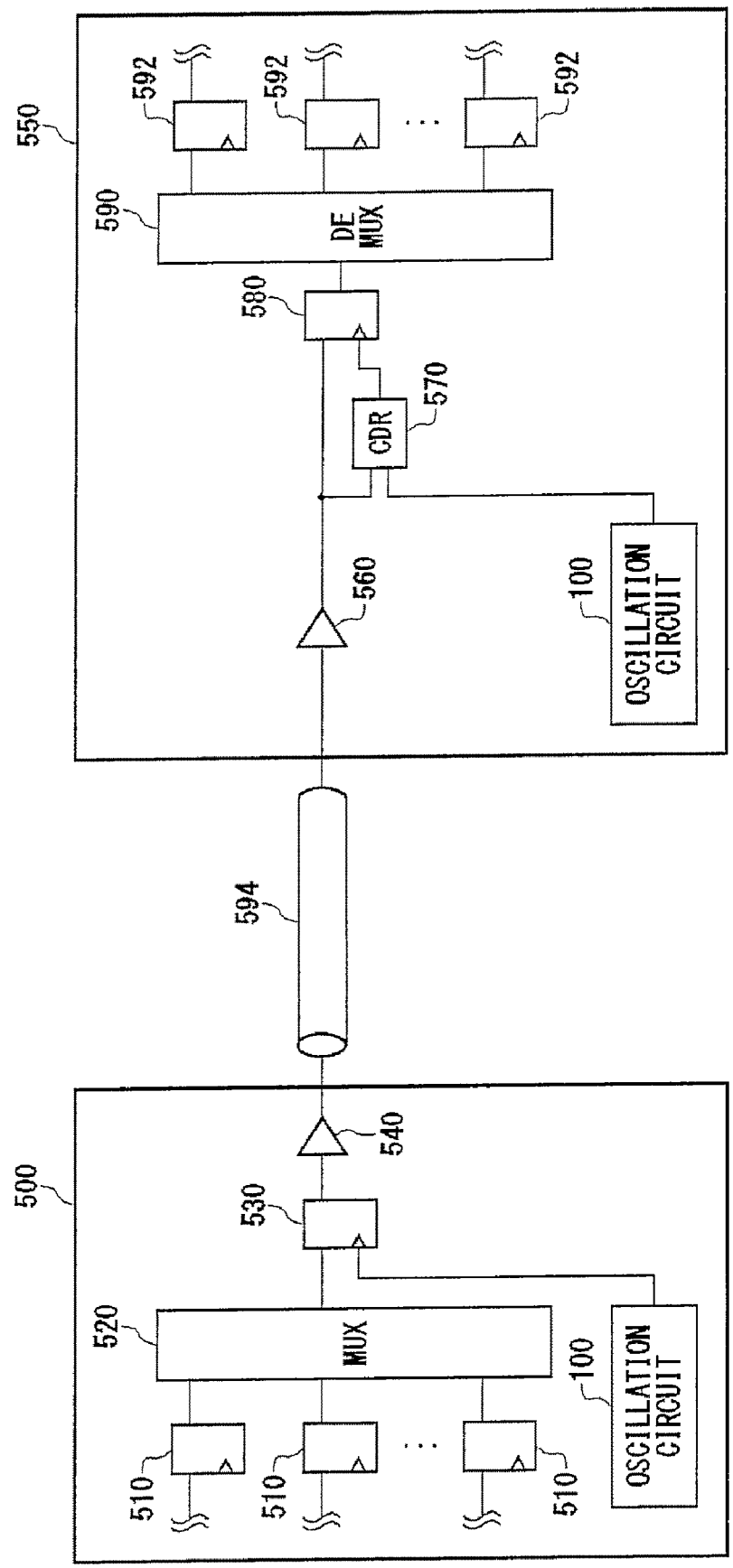
FIG. 7 shows an exemplary configuration of a transmission circuit 600 according to an embodiment of the present invention.

FIG. 7 shows an exemplary configuration of a transmission circuit 600 according to an embodiment of the present invention. The transmission circuit 600 is for example a SerDes circuit transmitting serial data converted from parallel data, and includes a transmission-side circuit 500, a transmission path 594, and a reception-side circuit 550.

The transmission-side circuit 500 includes a plurality of flip-flops 510, a multiplexer 520, an oscillation circuit 100, a flip-flop 530, and a buffer 540. The number of flip-flops 510 corresponds to the number of bits of the parallel data. Each flip-flop 510 sequentially fetches bit data corresponding to parallel data and outputs the bit data.

The multiplexer 520 converts parallel data fetched by the plurality of flip-flops 510, into serial data and outputs the serial data. The flip-flop 530 sequentially fetches the serial data outputted from the multiplexer 520 in response to a supplied clock signal, and outputs the serial data to the buffer 540.

The oscillation circuit 100 generates an oscillation signal based on a supplied reference clock, and supplies the generated oscillation signal to the flip-flop 530 as a clock signal. The buffer 540 outputs, to the transmission path 594, a signal in response to the received serial data. According to the stated configuration, the parallel data is outputted after converted into the serial data.

The reception-side circuit 550 includes a buffer 560, a regeneration clock generating section 570, an oscillation circuit 100, a flip-flop 580, a demultiplexer 590, and a plurality of flip-flops 592. The buffer 560 receives serial data from the transmission path 594, and supplies the serial data to the flip-flop 580 and to the regeneration clock generating section 570.

The regeneration clock generating section 570 operates according to an oscillation signal generated by the oscillation circuit 100, and generates a regeneration clock synchronized with the received serial data. The flip-flop 580 sequentially fetches the serial data and outputs the serial data in response to the regeneration clock. The demultiplexer 590 converts the serial data outputted from the flip-flop 580, into parallel data. The number of flip-flops 592 corresponds to the number of bits of the parallel data, so that each flip-flop 592 sequentially fetches the corresponding bit data and outputs the bit data.

The transmission circuit 600 in the present embodiment is able to supply, to the flip-flop 530 and the flip-flop 580, a clock signal, the frequency and the phase of which are controlled with high accuracy, and so that the flip-flop 530 and the flip-flop 580 can accurately fetch serial data. Therefore the bit error rate can be reduced in data transmission.

Although the present invention has been described by way of exemplary embodiments, the technical scope of the present invention is not limited to the scope of disclosure of the above embodiments. It is possible to make many changes and substitutions to the above embodiments. It is clear from the claims that embodiments including such changes and substitutions can also be included in the technical scope of the present invention.

As is clear from the foregoing, according to the embodiment of the present invention, it is possible to achieve an oscillation circuit, a test apparatus, and an electronic device which can generate an oscillation signal, the frequency and the phase of which are controlled with high accuracy.

What is claimed is:

1. An oscillation circuit for generating an oscillation signal synchronized with a supplied reference clock, comprising:
  a voltage control oscillation section that, when triggered by each edge of the reference clock, stops oscillation of the oscillation signal having a frequency in accordance with a supplied control voltage and starts new oscillation;
  a phase comparing section that phase compares a comparison signal having a phase in accordance with the oscillation signal outputted from the voltage control oscillation section with a signal having a phase in accordance with the reference clock;
  a voltage control section that supplies the control voltage in accordance with a comparison result of the phase comparing section, to the voltage control oscillation section;
  a pulser that outputs a pulse signal having a predetermined pulse width according to the edge of the reference clock, wherein
  the voltage control oscillation section stops generation of the oscillation signal in accordance with a leading edge of each pulse of the pulse signal, and starts generating a new oscillation signal in accordance with a trailing edge of each pulse of the pulse signal,
  the phase comparing section phase compares the comparison signal with the pulse signal;
  the voltage control oscillation section includes a plurality of NAND circuits, the NAND circuits connected into a loop including a first NAND circuit in the leading end and a second NAND circuit in the trailing end, each of the NAND circuits having a delay amount that changes according to the control voltage,
  the voltage control oscillation section outputs a signal outputted from any of the NAND circuits, as the oscillation signal, the pulser outputs a pulse signal indicating a logical value L during a period of the predetermined pulse width from the timing of the edge of the reference clock, the first NAND circuit outputs a NAND between the signal outputted from the second NAND circuit and the pulse signal, to the NAND circuit in the subsequent stage, the second NAND circuit outputs a NAND between the signal outputted from the NAND circuit in the preceding stage and the pulse signal, as the loop signal, to the first NAND circuit, and the second NAND circuit includes:
- a loop output circuit that outputs, to the first NAND circuit, the NAND between the signal outputted from the NAND circuit in the preceding stage and the pulse signal, as the loop signal; and
- a comparison output circuit that outputs, to the phase comparing section, a NAND between the signal outputted from the NAND circuit in the preceding stage and a logical value H, as the comparison signal.

2. The oscillation circuit as set forth in claim 1, wherein a load capacity of the loop output circuit is substantially the same as a load capacity of the comparison output circuit.

3. The oscillation circuit as set forth in claim 1, wherein any of the NAND circuits other than the first NAND circuit and the second NAND circuit outputs an inverted signal of the signal outputted from a NAND circuit in the preceding stage, by outputting a NAND between the signal outputted from the NAND circuit in the preceding stage and a signal indicating a predetermined logical value.

4. The oscillation circuit as set forth in claim 1, wherein the pulser outputs a pulse signal having a pulse width smaller than half the cycle of the oscillation signal generated by the voltage control oscillation section.

5. The oscillation circuit as set forth in claim 1, wherein load capacities respectively of the NAND circuits are substantially the same as each other.

6. The oscillation circuit as set forth in claim 1, wherein the voltage control section includes:
- a digital-to-analogue converter that outputs a control voltage having a voltage level in accordance with a given set value; and
- a counter that increases or decreases the set value by a predetermined change amount in accordance with each comparison result outputted from the phase comparing section for each pulse of the pulse signal.

7. A test apparatus for testing a device under test, comprising:
- a pattern generating section that generates a test pattern for testing the device under test;
- an oscillation circuit that generates an oscillation signal in accordance with a frequency of a test signal to be inputted to the device under test, in synchronization with a supplied reference clock;
- a waveform shaping section that generates the test signal, based on the test pattern generated by the pattern generating section and the oscillation signal generated by the oscillation circuit; and
- a determining section that determines whether the device under test is defective or not, by comparing an output signal outputted from the device under test and an expected value pattern generated by the pattern generating section, wherein the oscillation circuit includes:
- a voltage control oscillation section that, when triggered by each edge of the reference clock, stops oscillation of the oscillation signal having a frequency in accordance with a supplied control voltage and starts new oscillation;
- a phase comparing section that phase compares a comparison signal having a phase in accordance with the oscillation signal outputted from the voltage control oscillation section with a signal having a phase in accordance with the reference clock; and
- a voltage control section that supplies the control voltage in accordance with a comparison result of the phase comparing section, to the voltage control oscillation section;
- a pulser that outputs a pulse signal having a predetermined pulse width according to the edge of the reference clock, wherein the voltage control oscillation section stops generation of the oscillation signal in accordance with a leading edge of each pulse of the pulse signal, and starts generating a new oscillation signal in accordance with a trailing edge of each pulse of the pulse signal, the phase comparing section phase compares the comparison signal with the pulse signal;

the voltage control oscillation section includes a plurality of NAND circuits, the NAND circuits connected into a loop including a first NAND circuit in the leading end and a second NAND circuit in the trailing end, each of the NAND circuits having a delay amount that changes according to the control voltage, the voltage control oscillation section outputs a signal outputted from any of the NAND circuits, as the oscillation signal, the pulser outputs a pulse signal indicating a logical value L during a period of the predetermined pulse width from the timing of the edge of the reference clock, the first NAND circuit outputs a NAND between the signal outputted from the second NAND circuit and the pulse signal, to the NAND circuit in the subsequent stage, the second NAND circuit outputs a NAND between the signal outputted from the NAND circuit in the preceding stage and the pulse signal, as the loop signal, to the first NAND circuit, and the second NAND circuit includes:
- a loop output circuit that outputs, to the first NAND circuit, the NAND between the signal outputted from the NAND circuit in the preceding stage and the pulse signal, as the loop signal; and
- a comparison output circuit that outputs, to the phase comparing section, a NAND between the signal outputted from the NAND circuit in the preceding stage and a logical value H, as the comparison signal.

8. An electronic device including a plurality of operation circuits to operate according to a clock signal having a predetermined frequency, comprising:
- a plurality of oscillation circuits corresponding to the plurality of operation circuits, each oscillation circuit supplying the clock signal to a corresponding operation circuit; and
- a distribution buffer that receives a reference clock having a frequency smaller than the predetermined frequency from outside, and distributes the reference clock to each of the oscillation circuits, wherein each of the oscillation circuits includes:
- a voltage control oscillation section that, when triggered by each edge of the reference clock, stops oscillation of the oscillation signal having a frequency in accordance with a supplied control voltage and starts new oscillation;

a phase comparing section that phase compares a comparison signal having a phase in accordance with the clock signal outputted from the voltage control oscillation section with a signal having a phase in accordance with the reference clock; and a voltage control section that supplies the control voltage in accordance with a comparison result of the phase comparing section, to the voltage control oscillation section;

a pulser that outputs a pulse signal having a predetermined pulse width according to the edge of the reference clock, wherein the voltage control oscillation section stops generation of the oscillation signal in accordance with a leading edge of each pulse of the pulse signal, and starts generating a new oscillation signal in accordance with a trailing edge of each pulse of the pulse signal, the phase comparing section phase compares the comparison signal with the pulse signal;

the voltage control oscillation section includes a plurality of NAND circuits, the NAND circuits connected into a loop including a first NAND circuit in the leading end and a second NAND circuit in the trailing end, each of the NAND circuits having a delay amount that changes according to the control voltage, the voltage control oscillation section outputs a signal outputted from any of the NAND circuits, as the oscillation signal, the pulser outputs a pulse signal indicating a logical value L during a period of the predetermined pulse width from the timing of the edge of the reference clock, the first NAND circuit outputs a NAND between the signal outputted from the second NAND circuit and the pulse signal, to the NAND circuit in the subsequent stage, the second NAND circuit outputs a NAND between the signal outputted from the NAND circuit in the preceding stage and the pulse signal, as the loop signal, to the first NAND circuit, and the second NAND circuit includes:

a loop output circuit that outputs, to the first NAND circuit, the NAND between the signal outputted from the NAND circuit in the preceding stage and the pulse signal, as the loop signal; and a comparison output circuit that outputs, to the phase comparing section, a NAND between the signal outputted from the NAND circuit in the preceding stage and a logical value H, as the comparison signal.

\* \* \* \* \*